United States Patent
Liu et al.

(10) Patent No.: US 9,799,646 B2
(45) Date of Patent: Oct. 24, 2017

(54) CASCODE CONFIGURED SEMICONDUCTOR COMPONENT

(71) Applicant: Semiconductor Components Industries, LLC, Phoenix, AZ (US)

(72) Inventors: Chun-Li Liu, Scottsdale, AZ (US); Ali Salih, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/196,461

(22) Filed: Jun. 29, 2016

(65) Prior Publication Data

US 2017/0025407 A1 Jan. 26, 2017

Related U.S. Application Data

(60) Provisional application No. 62/196,652, filed on Jul. 24, 2015.

(51) Int. Cl.
| | |
|---|---|
| *H01L 29/66* | (2006.01) |
| *H01L 27/06* | (2006.01) |
| *H01L 27/02* | (2006.01) |
| *H01L 29/20* | (2006.01) |
| *H01L 29/205* | (2006.01) |
| *H01L 29/778* | (2006.01) |
| *H01L 49/02* | (2006.01) |
| *H01L 29/866* | (2006.01) |

(52) U.S. Cl.
CPC ...... *H01L 27/0629* (2013.01); *H01L 27/0255* (2013.01); *H01L 27/0288* (2013.01); *H01L 28/20* (2013.01); *H01L 29/2003* (2013.01); *H01L 29/205* (2013.01); *H01L 29/66106* (2013.01); *H01L 29/66462* (2013.01); *H01L 29/7786* (2013.01); *H01L 29/866* (2013.01)

(58) Field of Classification Search
CPC ............. H01L 27/124; H01L 29/66969; H01L 27/088; H01L 23/528; H01L 27/0255; H01L 27/0629; H01L 29/778; H01L 29/7851; H01L 29/78609; H01L 51/0554; H01L 51/5203; G02F 1/1368; G09G 2300/0426
See application file for complete search history.

(56) References Cited

U.S. PATENT DOCUMENTS

| | | |
|---|---|---|
| 2011/0133251 A1 | 6/2011 | He |
| 2013/0069208 A1 | 3/2013 | Briere |
| 2013/0088280 A1 | 4/2013 | Lal et al. |
| 2016/0104697 A1* | 4/2016 | Cho ........................ H01L 23/04 257/195 |
| 2016/0126243 A1* | 5/2016 | Weis .................... H01L 27/0883 257/392 |

\* cited by examiner

*Primary Examiner* — Sonya D McCall Shepard
(74) *Attorney, Agent, or Firm* — Rennie William Dover

(57) ABSTRACT

In accordance with an embodiment, semiconductor component includes a compound semiconductor material based semiconductor device coupled to a silicon based semiconductor device and a protection element, wherein the silicon based semiconductor device is a transistor. The protection element is coupled in parallel across the silicon based semiconductor device and may be a resistor, a diode, or a transistor. In accordance with another embodiment, the silicon based semiconductor device is a diode. The compound semiconductor material may be shorted to a source of potential such as, for example, ground, with a shorting element.

20 Claims, 2 Drawing Sheets

US 9,799,646 B2

CASCODE CONFIGURED SEMICONDUCTOR COMPONENT

The present application is a nonprovisional application of Provisional Patent Application No. 62/196,652 filed on Jul. 24, 2015, by Chun-Li Liu et al., titled "CASCODE CONFIGURED SEMICONDUCTOR COMPONENT", which is hereby incorporated by reference in its entirety, and priority thereto for common subject matter is hereby claimed.

TECHNICAL FIELD

The present invention relates, in general, to electronics and, more particularly, to semiconductor structures thereof, and methods of forming semiconductor devices.

BACKGROUND

In the past, the semiconductor industry used various different device structures and methods to form semiconductor devices such as, for example, diodes, Schottky diodes, Field Effect Transistors (FETs), High Electron Mobility Transistors (HEMTs), etc. Devices such as diodes, Schottky diodes, and FETs were typically manufactured from a silicon substrate. Drawbacks with semiconductor devices manufactured from a silicon substrate include low breakdown voltages, excessive reverse leakage current, large forward voltage drops, unsuitably low switching characteristics, high power densities, and high costs of manufacture. To overcome these drawbacks, semiconductor manufacturers have turned to manufacturing semiconductor devices from compound semiconductor substrates such as, for example, III-N semiconductor substrates, III-V semiconductor substrates, II-VI semiconductor substrates, etc. Although these substrates have improved device performance, they are fragile and add to manufacturing costs. Thus, the semiconductor industry has begun using compound semiconductor substrates that are a combination of silicon and III-N materials to address the issues of cost, manufacturability, and fragility. A III-N compound semiconductor material formed on a silicon substrate or other semiconductor substrate has been described in U.S. Patent Application Publication Number 2011/0133251 A1 by Zhi He and published on Jun. 9, 2011, and in U.S. Patent Application Publication Number 2013/0069208 A1 by Michael A. Briere and published on Mar. 21, 2013.

Semiconductor manufacturers have used a combination of silicon semiconductor materials and III-N semiconductor materials to manufacture devices, such as a normally-on III-N depletion mode HEMT cascoded with a silicon device. Using this combination of materials helps achieve a normally-off state using a III-N depletion mode device that is normally-on. In cascoded devices configured as switches, the silicon device often operates in avalanche mode due to high leakage currents of the III-N device operating under a high drain bias. In the avalanche operating mode, the gate of the III-N device is under a large stress in which the absolute gate to source voltage exceeds the devices pinch-off voltage. Hard stress conditions such as operating the silicon device in the avalanche mode degrades device reliability, lowers the breakdown voltage, and increases leakage currents. Cascoded semiconductor devices have been described in U.S. Patent Application Publication Number 2013/0088280 A1 by Rakesh K. Lal et al. and published on Apr. 11, 2013.

Accordingly, it would be advantageous to have a cascoded semiconductor device structure and a method for manufacturing the cascoded semiconductor device. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
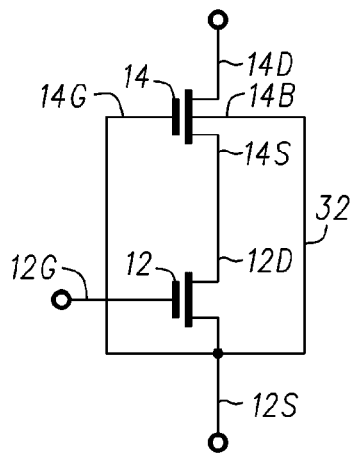
FIG. 1 is a circuit schematic of a cascoded semiconductor component that includes a compound semiconductor substrate in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain N-channel or P-channel devices, or certain N-type or P-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of being exactly as described.

DETAILED DESCRIPTION

Generally, the present invention provides a semiconductor component comprising a semiconductor device configured from a silicon based material, a semiconductor device configured from a III-N semiconductor material, and a protection element. The semiconductor device configured from the silicon based semiconductor material has at least a pair of current carrying terminals and the semiconductor device configured from the III-N semiconductor material has a control terminal and a pair of current carrying terminals. A current carrying terminal of the silicon based semiconductor device is connected to a current carrying terminal of the III-N semiconductor device to form a common connection node and the control terminal of the III-N semiconductor device is connected to the other current carrying terminal of the silicon based semiconductor device. The protection element has a terminal connected to the common connection node and a terminal commonly connected to the other current carrying terminal of the silicon based semiconductor device and to the control terminal of the III-N semiconductor device to form a terminal of the semiconductor component. The other current carrying terminal of the III-N semiconductor device serves as another terminal of the semiconductor component. The protection element may be referred to as a current steering element.

FIG. 1 is a circuit schematic of a III-N semiconductor component 10 in accordance with an embodiment of the present invention. What is shown in FIG. 1 is a semiconductor device 12 coupled to a semiconductor device 14 and configured to form a cascode switch. By way of example, semiconductor devices 12 and 14 are transistors, wherein each transistor is formed from a semiconductor substrate and has a gate terminal, a source terminal, a drain terminal, and a body region or substrate region from which a channel may be formed. The body region is a portion of the substrate. Thus, transistor 12 has a drain terminal 12D, a source terminal 12S, a gate terminal 12G, and a body terminal 12B and transistor 14 has a drain terminal 14D, a source terminal 14S, a gate terminal 14G, and a body terminal 14B. Drain terminal 12D of transistor 12 is connected to source terminal 14S of transistor 14 and source terminal 12S of transistor 12 is connected to gate terminal 14G of transistor 14. As discussed above, the gate terminal of a transistor may be referred to as a gate or gate electrode, the source terminal may be referred to as a source, a source electrode, a current carrying terminal or a current carrying electrode, the drain terminal may be referred to as a drain, a drain electrode, a current carrying terminal, or a current carrying electrode, and the body terminal may be referred to as a substrate terminal, substrate connection, or body connection. The source terminal of transistor 12 may be referred to as the source of cascode switch 10, the drain terminal of transistor 14 may be referred to as the drain of cascode switch 10, and the gate terminal of transistor 12 may be referred to as the gate of the cascode switch 10.

In accordance with an embodiment, the substrate of transistor 14 is electrically connected to the source of cascode switch 10 through body terminal 14B. By way of example, the substrate terminal or body terminal 14B of transistor 14 is electrically connected to the source electrode of cascode switch 10 by a means 32 for shorting the substrate from which transistor 14 is manufactured to the source of cascode switch 10. Substrate terminal or body terminal 14B of transistor 14 may be connected to a source of operating potential such as, for example, ground potential. By way of example, shorting means 32 is a shorting interconnect that shorts the substrate from which transistor 14 is manufactured to the source of cascode switch 10.

In accordance with an embodiment, transistor 12 is manufactured from a silicon based material and transistor 14 is manufactured from a III-N semiconductor material. A silicon based material may include silicon, carbon doped silicon, silicon carbide material, silicon germanium material, silicon in combination with aluminum nitride, etc. A III-N semiconductor material includes gallium nitride, aluminum gallium nitride, etc. The silicon may be of P-type conductivity, N-type conductivity, or an intrinsic semiconductor material. Likewise, the III-N semiconductor material may be of P-type conductivity, N-type conductivity, or an intrinsic semiconductor material. It should be noted that the III-N material of semiconductor device 14 may be grown on a silicon substrate or some other substrate material.

It should be appreciated that transistor 14 is manufactured from a III-N semiconductor material such that the source, drain, and gates are formed from portions of the III-N substrate material. The III-N semiconductor material may be referred to as a III-N substrate material, a substrate or a substrate material. The III-N substrate material is coupled to source terminal 12S of transistor 12 by shorting means 32. Transistor 12 is manufactured from a silicon based semiconductor material such that the source, drain, and gates are formed from portions of the silicon based semiconductor material. The silicon based semiconductor material may be referred to as a silicon based substrate material, a substrate or a substrate material.

Figure 2:
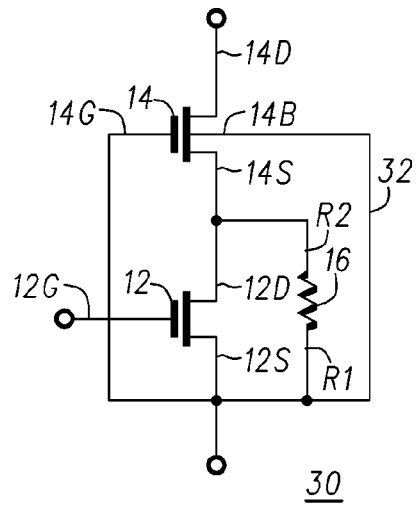
FIG. 2 is a circuit schematic of a cascoded semiconductor component that includes a compound semiconductor substrate in accordance with another embodiment of the present invention.

FIG. 2 is a circuit schematic of a cascode switch 30 in accordance with another embodiment of the present invention. A passive protection element such as, for example, a resistor 16 is coupled in parallel with transistor 12, i.e., resistor 16 has a terminal R1 connected to source terminal 12S of transistor 12 and a terminal R2 connected to drain terminal 12D of transistor 12. It should be noted that a passive protection element is a passive circuit element. The terminal of resistor 16 that is connected to the drain terminal of transistor 12, i.e., terminal R2, is also connected to source terminal 14S of transistor 14 and the terminal of resistor 16 connected to source terminal 12S of transistor 12, i.e., terminal R1, is also connected to gate terminal 14G of transistor 14. Protection element 16 may be referred to as a current steering element, a parallel element, or a leakage path circuit.

In accordance with another embodiment, source terminal 12S of transistor 12, gate terminal 14G of transistor 14, and terminal R1 of resistor 16 are coupled for receiving a source of operating potential $V_{SS}$. By way of example, source of operating potential $V_{SS}$ is ground.

It should be noted that semiconductor device 12, semiconductor device 14, and passive protection element 16 may be monolithically integrated; or semiconductor device 12 and semiconductor device 14 may be monolithically integrated and passive protection element 16 may not be monolithically integrated with semiconductor device 12 and semiconductor device 14; or semiconductor device 12 and passive protection element 16 may be monolithically integrated and semiconductor device 14 may not be monolithically integrated with semiconductor device 12 and passive protection element 16; or semiconductor device 14 and passive protection element 16 may be monolithically integrated and semiconductor device 12 may not be monolithically integrated with semiconductor device 12 and passive protection element 16.

Figure 3:
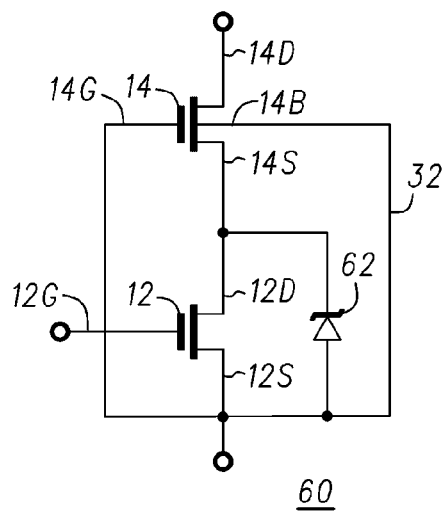
FIG. 3 is a circuit schematic of a cascoded semiconductor component that includes a compound semiconductor substrate in accordance with another embodiment of the present invention.

FIG. 3 is a circuit schematic of a semiconductor component 60 in accordance with another embodiment of the present invention. Semiconductor component 60 includes transistor 12 connected to transistor 14 and a shorting means 32 as described with reference to FIGS. 1 and 2. Cascode switch 60 differs from cascode switch 10 by the addition of a Zener diode 62 coupled in a parallel configuration with transistor 12, where Zener diode 62 serves as an active protection element, i.e., the active protection element is an active circuit element. In accordance with the embodiment of FIG. 3, active protection element 62 is a Zener diode having a cathode and an anode where the cathode of Zener diode 62 is connected to drain terminal 12D of transistor 12 and the anode of Zener diode 62 is connected to source terminal 12S of transistor 12. The cathode of Zener diode 62 is also connected to source terminal 14S of transistor 14 and the anode of Zener diode 62 is also connected to gate terminal 14G of transistor 14. It should be noted that semiconductor component 60 differs from semiconductor component 30 in that passive protection element 16, i.e., resistor 16, is replaced by an action protection element, i.e., Zener diode 62.

In accordance with an embodiment, source terminal 12S of transistor 12, gate terminal 14G of transistor 14, and the anode of Zener diode 52 are coupled for receiving a source of operating potential $V_{SS}$. By way of example, source of operating potential $V_{SS}$ is ground.

Figure 4:
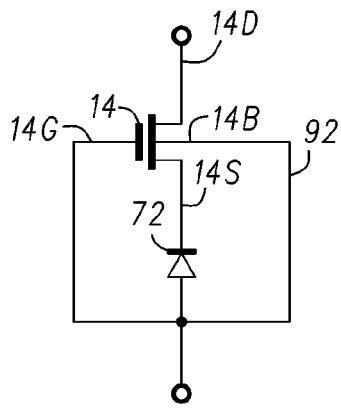
FIG. 4 is a circuit schematic of a cascoded semiconductor component that includes a compound semiconductor substrate in accordance with another embodiment of the present invention.

FIG. 4 is a circuit schematic of a III-N semiconductor component 70 in accordance with another embodiment of the present invention. What is shown in FIG. 4 is a semiconductor device 72 coupled to semiconductor device 14 and configured to form a cascode rectifier. By way of example, semiconductor device 72 is a diode and semiconductor device 14 is a transistor, wherein diode 72 has a cathode and an anode, and transistor 14 has a gate terminal 14G, a source terminal 14S, a drain terminal 14D, and a body terminal 14B. The cathode of diode 72 is connected to source terminal 14S of transistor 14 and the anode of diode 72 is connected to gate terminal 14G of transistor 14. Transistor 14 has been described with reference to FIG. 1.

In accordance with an embodiment, the substrate of transistor 14 is electrically connected to the source of cascode rectifier 70. By way of example, substrate terminal or body terminal 14B of transistor 14 is electrically connected to the source electrode of cascode rectifier 70 by a means 92 for shorting the substrate from which transistor 14 is manufactured to the source of cascode rectifier 70. The substrate of transistor 14 may be connected to ground potential. By way of example, shorting means 92 is a shorting interconnect that shorts the substrate from which transistor 14 is manufactured to the source of cascode rectifier 70.

In accordance with an embodiment, semiconductor device 72 is manufactured from a silicon based material and semiconductor device 14 is manufactured from a III-N semiconductor material. A silicon based material may include silicon, carbon doped silicon, silicon carbide material, silicon germanium material, silicon in combination with aluminum nitride, etc. A III-N semiconductor material includes gallium nitride, aluminum gallium nitride, etc. The silicon may be of P-type conductivity, N-type conductivity, or an intrinsic semiconductor material. Likewise, the III-N semiconductor material may be of P-type conductivity, N-type conductivity, or an intrinsic semiconductor material.

It should be noted that the III-N material of semiconductor device 14 may be grown on a silicon substrate or some other substrate material.

It should be appreciated that semiconductor device 14 is manufactured from a III-N semiconductor material such that the source, drain, and gates are formed from portions of the III-N substrate material. The III-N semiconductor material may be referred to as a III-N substrate material, a substrate or a substrate material. The III-N substrate material is coupled to the anode of diode 72 by shorting means 92. Diode 72 is manufactured from a silicon based semiconductor material such that the source, drain, and gates are formed from portions of the silicon based semiconductor material. The silicon based semiconductor material may be referred to as a silicon based substrate material, a substrate or a substrate material.

In accordance with another embodiment, the III-N semiconductor substrate is coupled to ground, i.e., the III-N semiconductor substrate is grounded.

In accordance with another embodiment, the anode terminal of diode 72, gate terminal 14G of transistor 14, and the terminal of resistor 76 connected to the anode terminal of diode 72 are coupled for receiving a source of operating potential $V_{SS}$. By way of example, source of operating potential $V_{SS}$ is ground.

It should be noted that semiconductor device 72 and semiconductor device 14 may be monolithically integrated; or semiconductor device 72 and semiconductor device 14 may be monolithically integrated and shorting means 92 may not be monolithically integrated with semiconductor device 72 and semiconductor device 14; or semiconductor device 72, semiconductor device 14, and shorting means 92 may be monolithically integrated.

Figure 5:
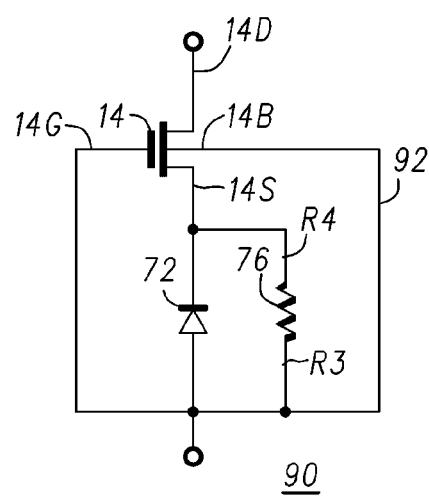
FIG. 5 is a circuit schematic of a cascoded semiconductor component that includes a compound semiconductor substrate in accordance with another embodiment of the present invention.

FIG. 5 is a circuit schematic of a semiconductor component 90 in accordance with another embodiment of the present invention. Semiconductor component 90 differs from semiconductor component 70 because of the addition of a passive protection element such as, for example, a resistor 76 coupled in parallel with diode 72, i.e., resistor 76 has a terminal R3 connected to the anode of diode 72 and a terminal R4 connected to the cathode of diode 72. It should be noted that an active protection element is a passive circuit element. Terminal R4 of resistor 76 connected to the cathode of diode 72 is also connected to source terminal 14S of transistor 14 and terminal R3 of resistor 76 connected to the anode of diode 72 is also connected to gate terminal 14G of transistor 14. Passive protection element 76 may be referred to as a current steering element, a parallel element, or a leakage path circuit.

In accordance with an embodiment, the anode terminal of diode 72, gate terminal 14G of transistor 14, the substrate terminal or body terminal 14B of transistor 14, and terminal R3 of resistor 76 connected to the anode terminal of diode 72 are coupled for receiving a source of operating potential $V_{SS}$. By way of example, source of operating potential $V_{SS}$ is ground.

It should be noted that semiconductor device 72, semiconductor device 14, and passive protection element 76 may be monolithically integrated; or semiconductor device 72 and semiconductor device 14 may be monolithically integrated and passive protection element 76 may not be monolithically integrated with semiconductor device 72 and semiconductor device 14; or semiconductor device 72 and passive protection element 76 may be monolithically integrated and semiconductor device 14 may not be monolithically integrated with semiconductor device 72 and passive protection element 76; or semiconductor device 14 and passive protection element 76 may be monolithically integrated and semiconductor device 72 may not be monolithically integrated with semiconductor device 14 and passive protection element 76.

Figure 6:
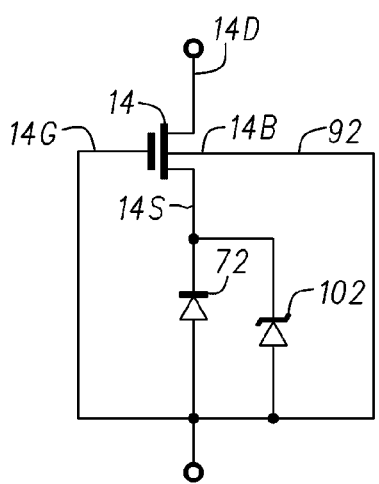
FIG. 6 is a circuit schematic of a cascoded semiconductor component that includes a compound semiconductor substrate in accordance with another embodiment of the present invention.

FIG. 6 is a circuit schematic of a semiconductor component 100 in accordance with another embodiment of the present invention. Semiconductor component 100 includes diode 72 connected to transistor 14 as described with reference to FIG. 4. An active protection element 102 is connected in a parallel configuration with diode 72, where active protection element 102 is an active circuit element. In accordance with the embodiment of FIG. 6, active protection element 102 is a Zener diode having a cathode and an anode wherein the cathode of Zener diode 102 is connected to the cathode of diode 72 and the anode of Zener diode 102 is connected to the anode of diode 72. The cathode of Zener diode 102 is also connected to source terminal 14S of transistor 14 and the anode of Zener diode 102 is also connected to gate terminal 14G of transistor 14. It should be noted that semiconductor component 100 differs from semiconductor component 90 in that resistor 76 is replaced by Zener diode 102.

In accordance with an embodiment, the anode terminal of diode 72, gate terminal 14G of transistor 14, and the anode terminal of Zener diode 102 are coupled for receiving a source of operating potential $V_{SS}$. By way of example, source of operating potential $V_{SS}$ is ground.

It should be noted that semiconductor device 72, semiconductor device 14, and active protection element 102 may be monolithically integrated; or semiconductor device 72 and semiconductor device 14 may be monolithically integrated and active protection element 102 may not be monolithically integrated with semiconductor device 72 and semiconductor device 14; or semiconductor device 72 and active protection element 102 may be monolithically integrated and semiconductor device 14 may not be monolithically integrated with semiconductor device 72 and active protection element 102; or semiconductor device 14 and active protection element 102 may be monolithically integrated and semiconductor device 72 may not be monolithically integrated with semiconductor device 14 and active protection element 102.

By now it should be appreciated that a semiconductor component comprising a compound semiconductor material based transistor monolithically integrated with a silicon semiconductor based transistor has been provided. In accordance with an embodiment, the semiconductor component includes a III-N based semiconductor device such as, for example, a normally-on III-N depletion mode HEMT cascoded with a silicon based device such as, for example, a field effect transistor manufactured from a silicon substrate or a diode manufactured from a silicon substrate. A component is coupled in parallel across the silicon based device to shunt leakage currents that occur in response to the gate-to-source voltage of the III-N depletion mode HEMT exceeding its pinch-off voltage. Thus, elements such as, for example, resistors 16 and 76 and Zener diodes 62 and 102 may be referred to as current shunt elements, a current shunt devices, current by-pass elements, or the like. These elements serve as a means for electrically connecting a III-N semiconductor material to a silicon based semiconductor device. The parallel coupled component controls leakage current and the voltage at the common connection node formed by the source of the III-N based transistor and the drain of the silicon based transistor. The parallel coupled component may be a resistor, a diode, a transistor, or the like and may be referred to as a current steering device, current steering element, a protection device, or a protection element. Including the parallel coupled component increases reliability of semiconductor components that include III-N based devices cascoded with silicon based devices and in which the III-N based devices operate under high stress conditions. The semiconductor material of the III-N based semiconductor device may be connected to a source of potential such as, for example, ground with a shorting wire or to the source of the silicon based device in embodiments where the silicon based semiconductor device is a transistor or to the anode of the silicon based semiconductor device in embodiments in which the silicon based semiconductor device is a diode.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A semiconductor component having at least first and second terminals, comprising:
    a first semiconductor device having first and second current carrying terminals, the first semiconductor device configured from a silicon based material;
    a second semiconductor device having a control terminal, first and second current carrying terminals, and a body terminal, the second semiconductor device configured from a III-N semiconductor material, the first current carrying terminal of the first semiconductor device coupled to the second current carrying terminal of the second semiconductor device, the control terminal of the second semiconductor device coupled to the second current carrying terminal of the first semiconductor device, and the body terminal of the second semiconductor device directly connected to the second current carrying terminal of the first semiconductor device; and
    a protection element having first and second terminals, the first terminal of the protection element coupled to the first current carrying terminal of the first semiconductor device and to the second current carrying terminal of the second semiconductor device.

2. The semiconductor component of claim 1, wherein the first semiconductor device is a first transistor, the second semiconductor device is a second transistor, and the silicon based semiconductor material is silicon of a first conductivity type.

3. The semiconductor component of claim 1, wherein the first semiconductor device is a first transistor, the second semiconductor device is a second transistor, and the silicon based semiconductor material is an intrinsic semiconductor material.

4. The semiconductor component of claim 2, wherein the first transistor, the second transistor, and the protection element are monolithically integrated.

5. The semiconductor component of claim 1, wherein the protection element is one of a passive circuit element or an active circuit element.

6. The semiconductor component of claim 1, wherein the III-N semiconductor material is configured for receiving a ground potential.

7. The semiconductor component of claim 1, wherein the III-N semiconductor material is electrically coupled to the second current carrying terminal of the first semiconductor device.

8. The semiconductor component of claim 1, wherein the protection element is a resistor.

9. The semiconductor component of claim 1, wherein the protection element is a Zener diode.

10. The semiconductor component of claim 9, wherein the first semiconductor device is a diode having a cathode and an anode, the cathode serving as the first current carrying terminal and the anode serving as the second current carrying terminal.

11. The semiconductor component of claim 1, wherein the protection element comprises a transistor having a control electrode and first and second current carrying electrodes, the control electrode coupled to the first current carrying electrode and the second current carrying electrode coupled for receiving a first source of operating potential.

12. A semiconductor component, comprising:
a silicon based semiconductor device formed from a silicon semiconductor material and having first and second current carrying terminals;
a III-N based semiconductor device formed from a III-N semiconductor material and having a control terminal, a first current carrying terminal, a second current carrying terminal, and a body terminal, the first current carrying terminal of the silicon based semiconductor material coupled to the control terminal of the III-N based semiconductor device, the second current carrying terminal of the silicon based semiconductor device coupled to the first current carrying terminal of the III-N semiconductor device; and
means for directly connecting the III-N semiconductor material to the first terminal of the silicon based semiconductor device.

13. The semiconductor component of claim 12, wherein the silicon based semiconductor device comprises a diode having an anode and a cathode and the III-N based semiconductor device comprises a field effect transistor having a gate, a source, and a drain, and wherein the anode of the diode serves as the first current carrying terminal of the silicon based semiconductor device, the cathode of the diode serves as the second current carrying electrode of the silicon based semiconductor device, the source of the field effect transistor serves as the first current carrying electrode of the III-N based semiconductor device, and the drain of the field effect transistor serves as the second current carrying electrode of the III-N based semiconductor device.

14. The semiconductor component of claim 13, further including a current by-pass element coupled to the cathode of the diode.

15. The semiconductor component of claim 14, wherein the current by-pass element comprises a resistor.

16. The semiconductor component of claim 14, wherein the current by-pass element comprises a Zener diode having a cathode and an anode, the cathode of the Zener diode coupled to the cathode of the diode.

17. A semiconductor component, comprising:
a silicon based semiconductor device formed from a silicon semiconductor material and having first and second current carrying terminals, wherein the silicon based semiconductor device comprises a first field effect transistor having a gate, a source, and a drain;
a III-N based semiconductor device formed from a III-N semiconductor material and having a control terminal, a first current carrying terminal, a second current carrying terminal, and a body terminal, the first current carrying terminal of the silicon based semiconductor material coupled to the control terminal of the III-N based semiconductor device, the second current carrying terminal of the silicon based semiconductor device coupled to the first current carrying terminal of the III-N semiconductor device, wherein the III-N based semiconductor device comprises a second field effect transistor having a gate, a source, a drain, and the body terminal, and wherein the source of the first field effect transistor serves as the first current carrying terminal of the silicon semiconductor based device, the drain of the first field effect transistor serves as the second current carrying electrode of the silicon based semiconductor device, the source of the second field effect transistor serves as the first current carrying electrode of the III-N based semiconductor device, and the drain of the second field effect transistor serves as the second current carrying electrode of the III-N based semiconductor device; and
means for electrically connecting the III-N semiconductor material to the first terminal of the silicon based semiconductor device.

18. The semiconductor component of claim 17, further including a current by-pass element coupled to the cathode of the diode, wherein the current by-pass element comprises one of a resistor, a Zener diode, or a diode connected transistor.

19. A cascode configured device having first, second, and third terminals, comprising:
a first semiconductor device formed from a silicon material, the first semiconductor device having at least first and second terminals; and
a second semiconductor device formed from a III-N semiconductor material, the second semiconductor device having first, second, third, and fourth terminals, the first terminal of the first semiconductor device coupled to the third terminal of the second semiconductor device, and the second terminal of the first semiconductor device coupled to the first terminal of the second semiconductor device, and the fourth terminal of the second semiconductor device directly coupled to the first terminal of the first semiconductor device.

20. The cascode configured device of claim 19, further including a current shunt device having first and second terminals, the first terminal of the current shunt device coupled to the second terminal of the first semiconductor device.

* * * * *